United States Patent
Mohammed et al.

(10) Patent No.: US 8,537,553 B2
(45) Date of Patent: Sep. 17, 2013

(54) DEVICES HAVING ANISOTROPIC CONDUCTIVITY HEATSINKS, AND METHODS OF MAKING THEREOF

(75) Inventors: Anwar Mohammed, San Jose, CA (US); Renzhe Zhao, Tustin, CA (US)

(73) Assignee: Futurewei Technologies, Inc., Plano, TX (US)

( * ) Notice: Subject to any disclaimer, the term of this patent is extended or adjusted under 35 U.S.C. 154(b) by 336 days.

(21) Appl. No.: 13/071,015

(22) Filed: Mar. 24, 2011

(65) Prior Publication Data

US 2012/0206882 A1    Aug. 16, 2012

Related U.S. Application Data

(60) Provisional application No. 61/442,552, filed on Feb. 14, 2011.

(51) Int. Cl.
   H05K 7/20    (2006.01)
(52) U.S. Cl.
   USPC ........... 361/710; 361/712; 361/761; 361/783; 361/803; 174/252; 174/260; 174/548
(58) Field of Classification Search
   USPC ................ 361/676, 679.46, 688, 701–722, 361/760–761, 774–775, 783, 803, 807
   See application file for complete search history.

(56) References Cited

U.S. PATENT DOCUMENTS

| | | | | |
|---|---|---|---|---|
| 6,521,990 B2 * | 2/2003 | Roh et al. | | 257/706 |
| 8,081,468 B2 * | 12/2011 | Hill et al. | | 361/710 |
| 8,130,500 B2 * | 3/2012 | Oda | | 361/710 |
| 2002/0197923 A1 * | 12/2002 | Tobita et al. | | 442/74 |
| 2006/0070720 A1 * | 4/2006 | Capp et al. | | 165/80.2 |
| 2006/0232932 A1 * | 10/2006 | Curtis et al. | | 361/697 |
| 2007/0000642 A1 | 1/2007 | Yamazaki et al. | | |
| 2007/0053168 A1 | 3/2007 | Sayir et al. | | |
| 2007/0285890 A1 * | 12/2007 | Tsao et al. | | 361/697 |
| 2008/0101026 A1 | 5/2008 | Ali | | |
| 2009/0282852 A1 * | 11/2009 | Venkatasubramanian et al. | | 62/259.2 |
| 2010/0033935 A1 * | 2/2010 | Chainer | | 361/718 |
| 2011/0101394 A1 * | 5/2011 | McKenzie et al. | | 257/98 |
| 2011/0228482 A1 * | 9/2011 | Schmidt et al. | | 361/705 |

FOREIGN PATENT DOCUMENTS

| | | |
|---|---|---|
| CN | 1893806 A | 1/2007 |
| CN | 101048055 A | 10/2007 |
| CN | 101529359 A | 9/2009 |
| JP | 2008124326 A | 5/2008 |

OTHER PUBLICATIONS

PCT, "International Search Report and Written Opinion of The International Searching Authority," PCT/CN2012/071118, filed Feb. 14, 2012, Applicant: Huawei Technologies Co., Ltd. et al., mail date May 17, 2012, 10 pages.

* cited by examiner

*Primary Examiner* — Courtney Smith
(74) *Attorney, Agent, or Firm* — Slater & Matsil, L.L.P.

(57) ABSTRACT

In accordance with an embodiment of the present invention, a device includes a circuit board with a thermally conductive core layer and a chip disposed over the circuit board. The device further includes a heat sink disposed over the chip. The thermal conductivity of the heat sink along a first direction is larger than a thermal conductivity along a second direction. The first direction is perpendicular to the second direction. The heat sink is thermally coupled to the thermally conductive core layer.

25 Claims, 11 Drawing Sheets

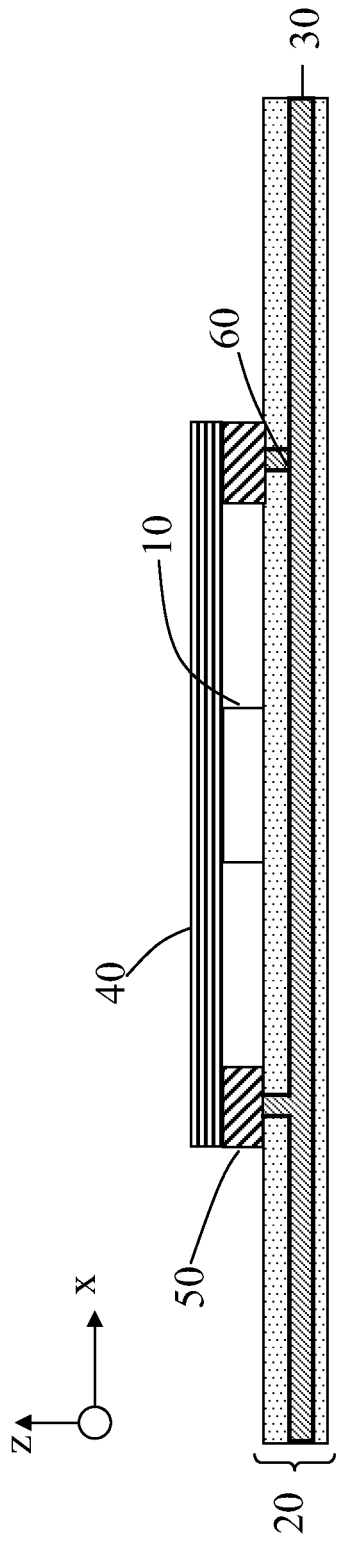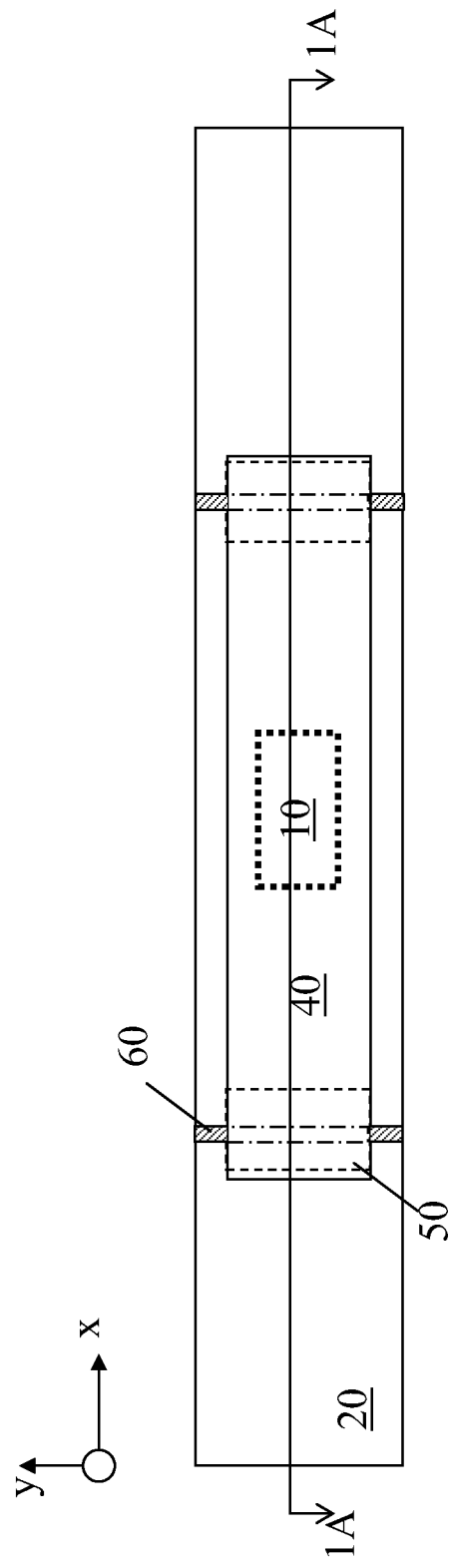

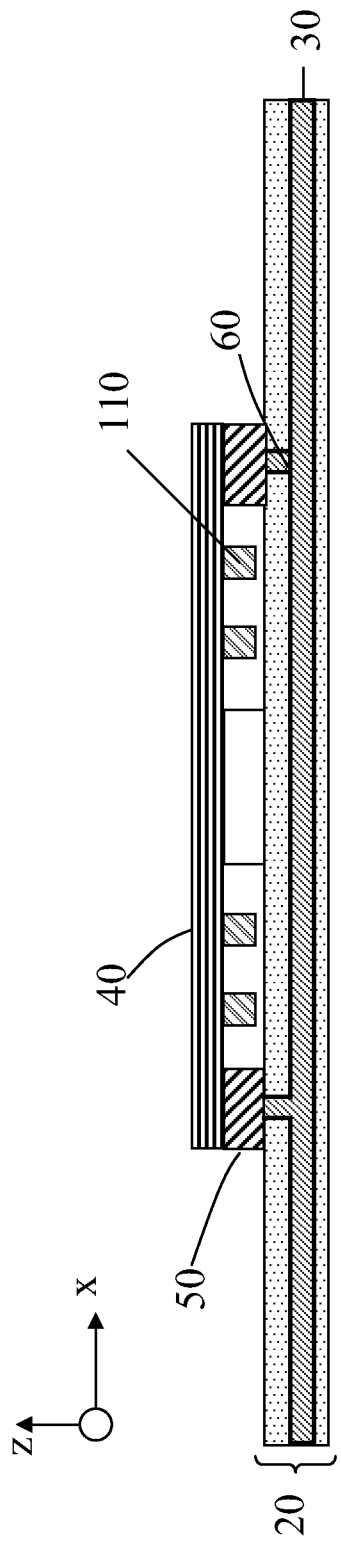
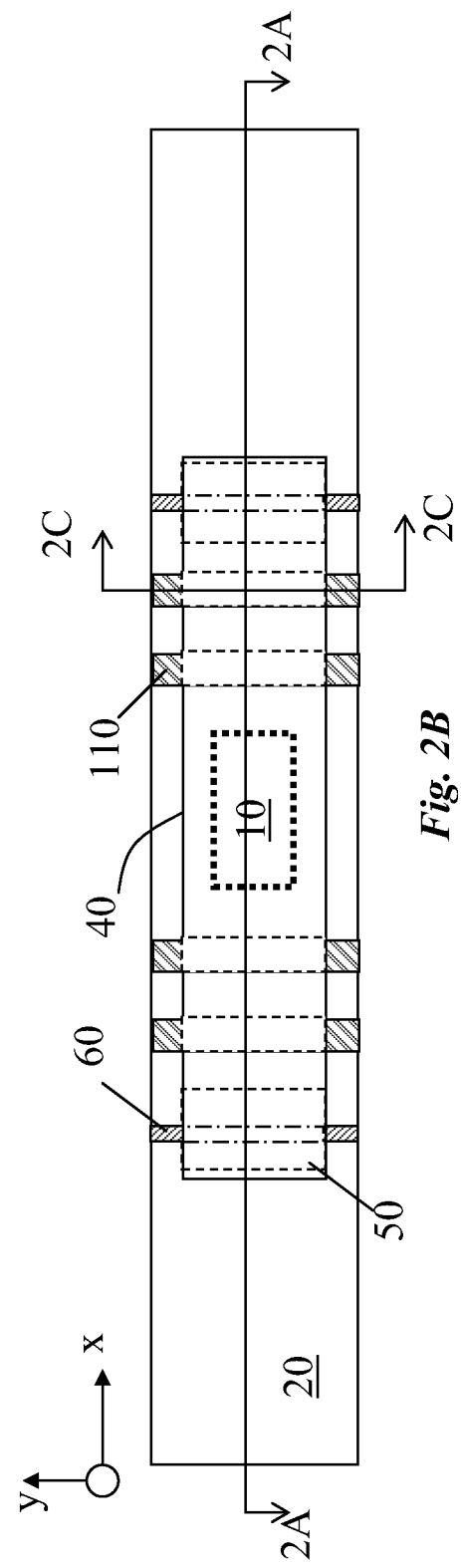
*Fig. 2A*
*Fig. 2B*

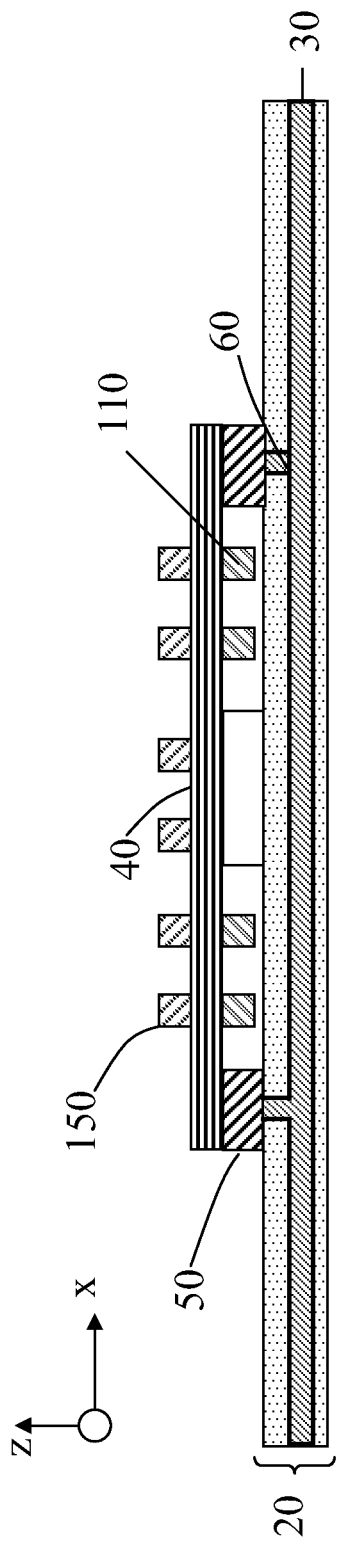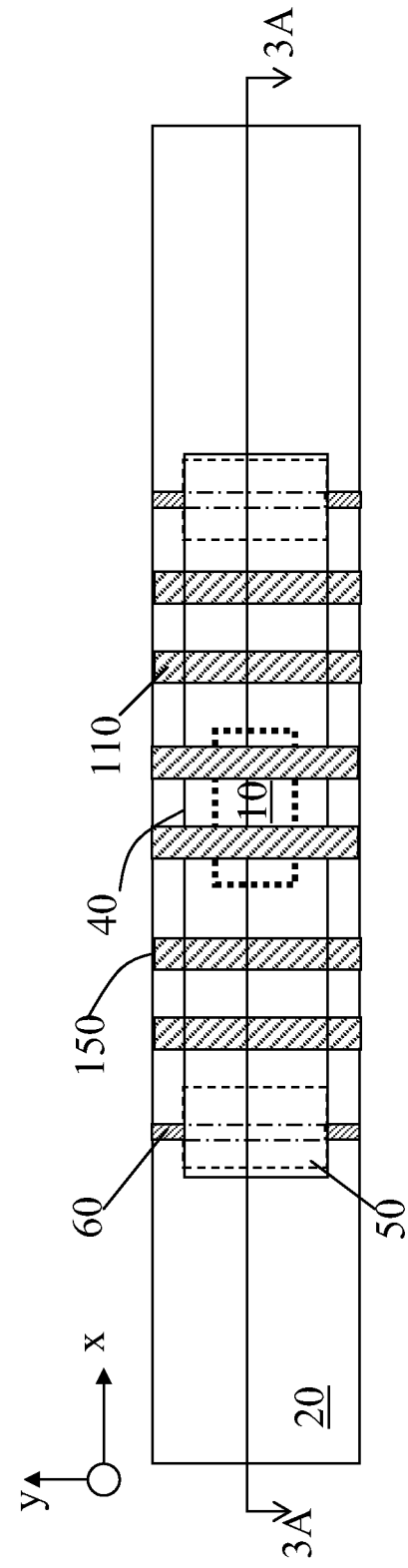

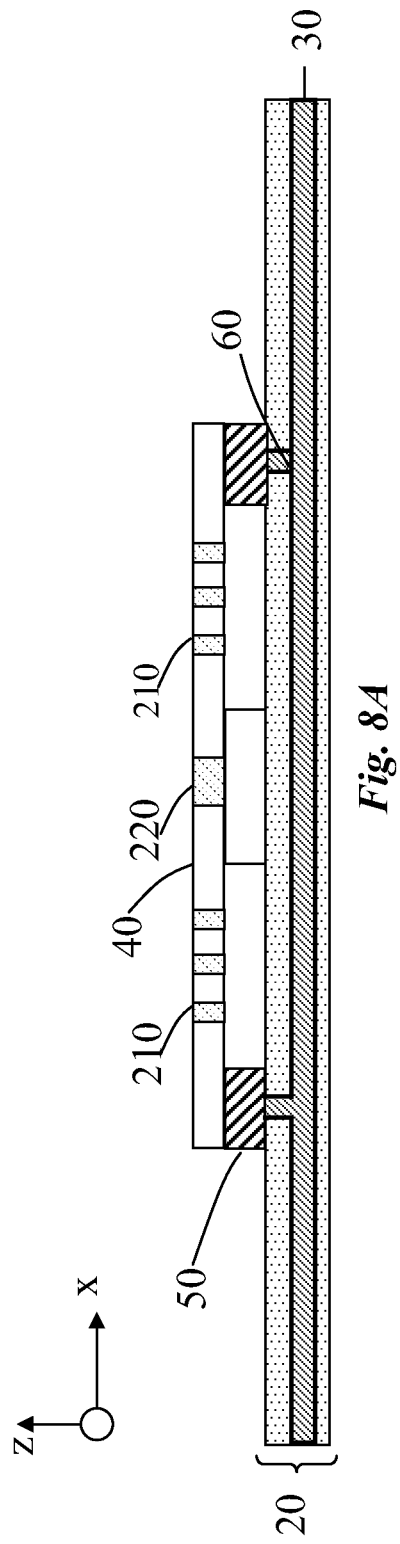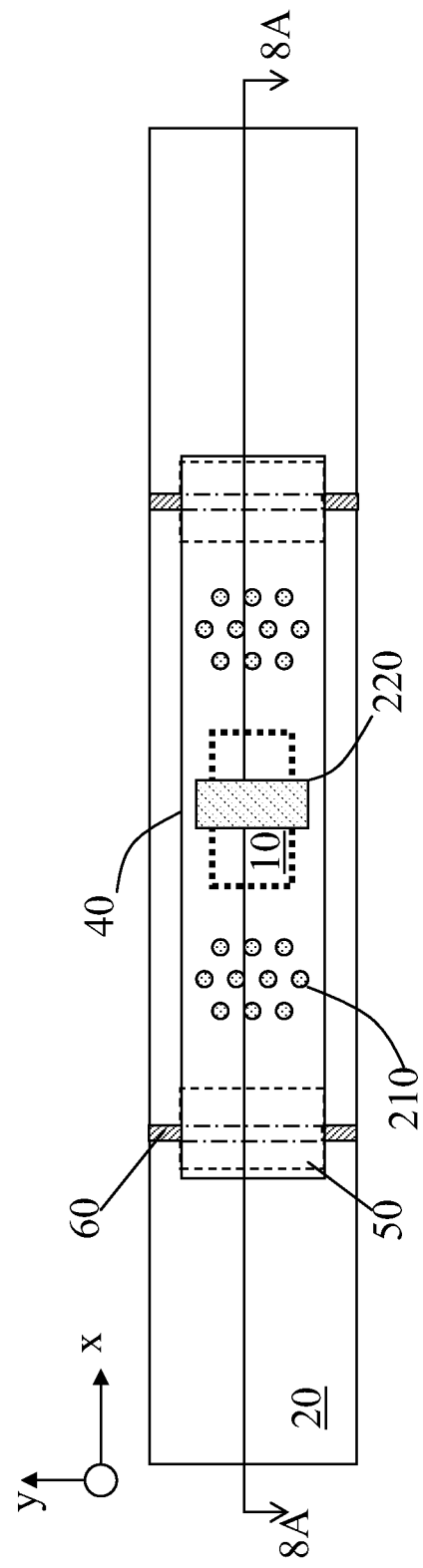

DEVICES HAVING ANISOTROPIC CONDUCTIVITY HEATSINKS, AND METHODS OF MAKING THEREOF

This application claims the benefit of U.S. Provisional Application No. 61/442,552, filed on Feb. 14, 2011, entitled "Anisotropic High Conductivity, Light Weight Heatsinks," which application is hereby incorporated herein by reference.

TECHNICAL FIELD

The present invention relates generally to heat sinks, and more particularly to devices having anisotropic conductivity heatsinks, and methods of making thereof.

BACKGROUND

As circuits keep on getting faster and denser, the thermal management becomes more and more challenging. Heatsink materials such as aluminum do not remove heat fast enough due to the lower thermal conductance of aluminum while materials with fast conductivity such as diamond, or diamond coated materials are prohibitively expensive and/or difficult to manufacture at high volumes with low costs. Although more expensive than aluminum, copper heatsinks have a relatively larger thermal conductance than aluminum. However, copper has a higher density than aluminum. Therefore, copper based heatsink are not suitable in many applications.

SUMMARY OF THE INVENTION

These and other problems are generally solved or circumvented, and technical advantages are generally achieved, by illustrative embodiments of the present invention.

In accordance with an embodiment of the present invention, a device comprises a circuit board having a thermally conductive core layer and a chip disposed over the circuit board. The device further comprises a heat sink disposed over the chip. The thermal conductivity of the heat sink along a first direction is larger than a thermal conductivity along a second direction. The first direction is perpendicular to the second direction. The heat sink is thermally coupled to the thermally conductive core layer.

In accordance with another embodiment of the present invention, a printed circuit board assembly comprises a substrate having a thermally conductive core layer and a semiconductor device disposed over the substrate. The printed circuit board assembly further comprises a heat sink having an anisotropic thermal conductivity disposed over the semiconductor device. The bottom surface of the heat sink is thermally coupled to the thermally conductive core layer. The bottom surface of the heat sink is closer to the semiconductor device than an opposite top surface of the heat sink.

In accordance with another embodiment of the present invention, a method for forming a printed circuit board assembly comprises placing a semiconductor device over a substrate, and placing a heat sink having an anisotropic thermal conductivity over the semiconductor device. The substrate has a thermally conductive core layer. The method further comprises thermally coupling a bottom surface of the heat sink to the thermally conductive core layer. The bottom surface of the heat sink is closer to the semiconductor device than an opposite top surface of the heat sink.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a anisotropic heatsink in accordance with an embodiment of the invention, wherein FIG. 1A illustrates a cross-sectional view and FIGS. 1B and 1C illustrate top views;

FIG. 2, which includes FIGS. 2A-2C, illustrates embodiments of the device in which a hotter side of a heat sink having anisotropic thermal conductivity is thermally coupled to fins, wherein FIGS. 2A and 2C illustrate cross-sectional views and FIG. 2B illustrates a top view;

FIG. 3, which includes FIGS. 3A-3B, illustrates an embodiment of the invention including top fins along with the heat sink, wherein FIG. 3A illustrates a cross-sectional view and FIG. 3B illustrates a top view;

FIG. 6, which includes

FIG. 8, which includes FIGS. 8A-8B, illustrates an embodiment of the invention including through via structures in the heat sink, wherein FIG. 8A illustrates a cross-sectional view and FIG. 8B illustrates a top view.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the invention use a light weight anisotropic heatsink to extract heat from chips. Unlike conventional heatsinks in which heat is extracted vertically from the top of the heatsink, at least a portion of the heat is removed laterally in anisotropic heatsinks described herein in various embodiments. Embodiments of the invention will be described for removing heat laterally using the substrate (e.g., circuit board) and/or bottom fins attached to the bottom surface of the anisotropic heat sink.

An illustrative embodiment of a heat sink assembly will be described using FIG. 1. Further embodiments of the invention will be described using FIGS. 2-8. A process for forming the heat sink assembly will be described using FIG. 9. In various embodiments, these embodiments described in FIG. 1-8 may be singly used or may be combined together. For example, a subset of FIGS. 1-8 may be combined together in some embodiments.

Figure 1C:
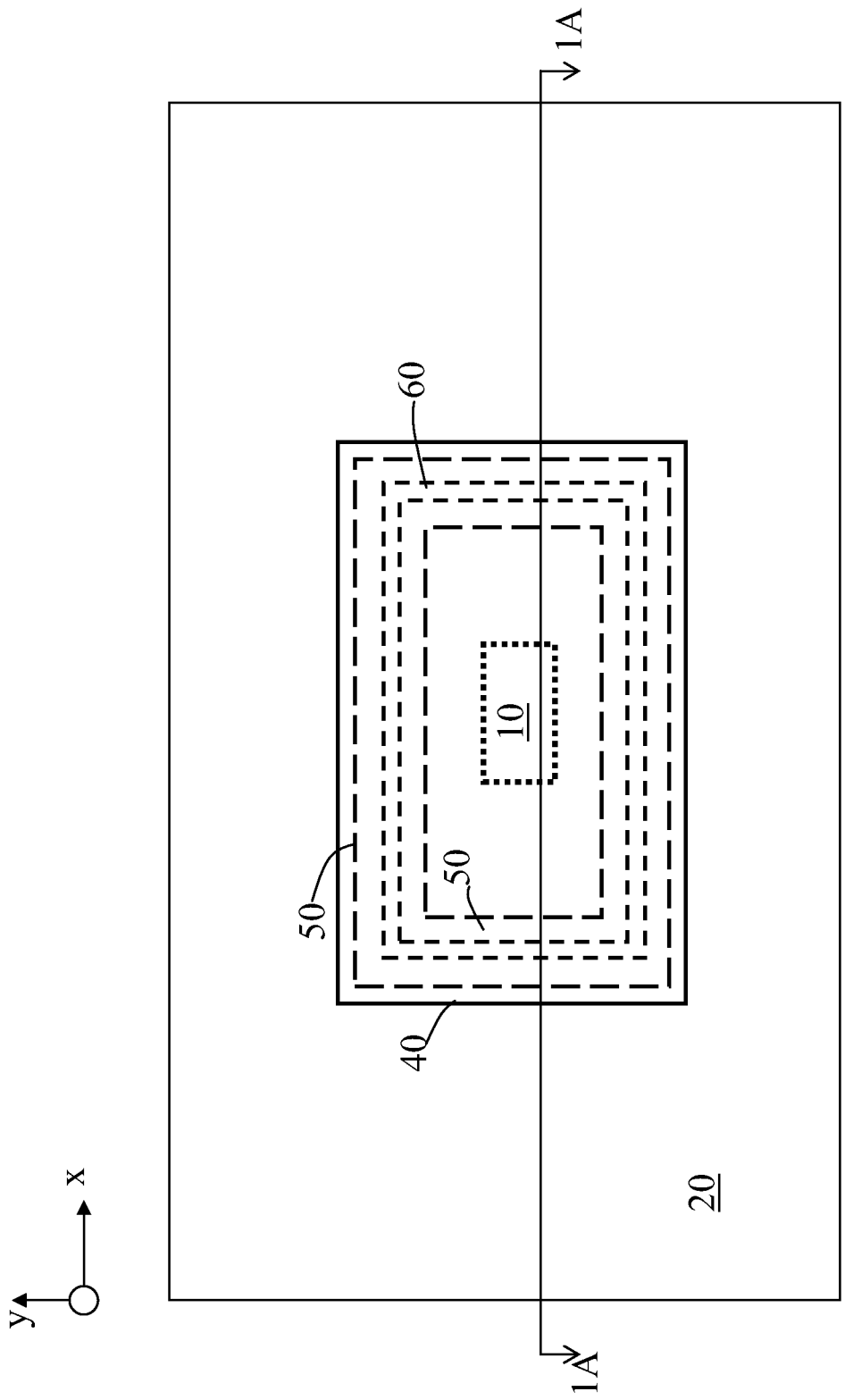

FIG. 1, which includes FIGS. 1A-1C, illustrates an anisotropic heatsink in accordance with an embodiment of the invention, wherein FIG. 1A illustrates a cross-sectional view and FIGS. 1B and 1C illustrate top views.

Referring to FIG. 1A, a chip 10 is mounted over a substrate 20. In various embodiments, the chip 10 may be any type of chip such as a microprocessor, a signal processor, an ASIC chip, a system on chip, a memory chip, programmable gate array chip etc. In various embodiments, the chip 10 may be a semiconductor package, a semiconductor die including a discrete device. Although only a single chip is illustrated embodiments of the invention also include multiple chips mounted over the substrate 20.

In various embodiments, the substrate 20 may be a circuit board, a line card etc. The top surface of the substrate 20 facing the chip 10 may include connectors, for example, to connect the chip 10 with external circuitry and other components attached to the substrate 20.

The substrate 20 may comprise a core layer 30 as illustrated in FIG. 1A. The core layer 30 may comprise a metallic material having a high thermal conductivity. In one or more embodiments, the core layer 30 comprises copper, aluminum, and combinations thereof.

The core layer 30 may be embedded within an insulating layer of the substrate 20 and may be separate from the connectors on the top surface of the substrate 20.

A heatsink 40 is disposed over a top surface of the chip 10 and securely attached to the chip 10. In various embodiments, the chip 10 is thermally coupled to the heatsink 40 through thermal conduction processes.

In various embodiments, the heatsink 40 and the chip 10 are coupled through a thermal interface material (TIM) layer. Large surface roughness (as well as other defects) at the bottom surface of the heatsink 40 and/or the top surface of the chip 10 can reduce contact area with voids occupying most of the interface area. Thermal conduction across the interface is limited through a fraction of the interface area. Typically, other forms of heat transfer (convection, radiation) through the air gaps are much less efficient than thermal conduction. TIMs may be introduced to overcome these limitations. For example, in various embodiments, a TIM layer may be inserted between the heatsink 40 and the chip 10 to increase the contact area thereby increasing the thermal heat dissipation from the chip 10.

The TIM layer may comprise any suitable material that increases the thermal contact area and has good thermal conductivity. Examples of material forming the TIM layer include thermal paste (such as grease), epoxy materials, phase change materials, thermal tapes, including graphite, polyimide, and aluminum tapes, silicone coated fabrics etc.

In various embodiments, a tape and/or screws may also be used to apply mechanical pressure thereby increasing the contact area between the heatsink 40 and the chip 10.

Similar to the interface with the chip 10, the heatsink 40 may be attached to the blocks 50 using a TIM layer. In some embodiments, the heatsink 40 may also be secured to the blocks 50 (e.g., by screwing it down) for maximizing the thermal interface area between the heatsink 40 and the blocks 50. In some embodiments, the blocks 50 may be positioned within grooves formed in the heatsink 40 so as to increase the contact area between the heatsink 40 and the blocks 50.

The heatsink 40 is coupled to the core layer 30 of the substrate 20 through blocks 50 and connecting members 60. The blocks 50 may be good thermal conductors such as metals and alloys including copper, gold, platinum, aluminum, and combinations thereof. The connecting members 60 may comprise copper, aluminum, for example, may be copper vias or trenches in one embodiment.

The blocks 50 may be coupled to the connecting members 60, for example, through solder joints or through other suitable connecting means. The connecting members 60 are coupled to the core layer 30 of the substrate 20, which then forms part of the heatsink. The large area of the core layer 30 helps to dissipate the thermal heat from the chip 10, which is being transferred through the heatsink 40.

In various embodiments, the heatsink 40 has an anisotropic thermal conductivity. In other words, the heatsink 40 is a better conductor in at least one horizontal direction (x-axis in FIG. 1A) than a vertical direction (z-axis in FIG. 1A). In some embodiments, the heatsink 40 has similar thermal conductivity along the horizontal plane (x-axis and y-axis than the z-axis). In various embodiments, advantageously, using the substrate 20 as a means for removing heat overcomes the inability of an anisotropic heat sink to remove heat vertically away from the chip 10 while allowing faster heat transfer out of the chip 10.

In one or more embodiments, the heatsink 40 comprises thermally conductive fibers oriented in x-y plane formed by the x-axis and y-axis. The layers of conductive fibers may be attached together using materials that may not be as thermally conductive as the conductive fibers. Because the conductive fibers are oriented along the x-axis and y-axis, the thermal conductivity along the x-y plane is much larger than the thermal conductivity along the vertical z-x or z-y planes. In various embodiments, the thermal conductivity of the heatsink 40 may be changed by modifying the ratio of the conductive fibers to the non-conductive matrix (such as epoxy).

In one or more embodiments, the conductive fibers may be carbon isotopes such as graphene, which has a structure of a mon-layer of graphite. For example, a graphene fiber composite may be used as the heatsink 40 in one embodiment. In various embodiments, the heatsink 40 comprises graphene layers joined together by a matrix, rolled graphene sheets including nano-tubes dispersed in a matrix, and/or stacks of graphene layers separated by the matrix and dispersed in the matrix. The matrix may comprise a suitable bonding matrix, e.g., epoxy and may be thermally less conductive than graphene. The graphene layers in the heatsink 40 are oriented along the x-y plane, which results in the highly anisotropic thermal properties of the heatsink 40.

In various embodiments, the heatsink 40 may have a thermal conductance along the x-axis, y-axis, and/or both x-axis and y-axis of about 500 W/mK to about 1200 W/mK, and about 1000 W/mK in one embodiment. In contrast, the z-axis thermal conductance may be less than about 100 W/mK, and about 20 W/mK in one embodiment.

Advantageously, while copper has a density of about 8 $g/cm^3$, and aluminum has a density of about 2.7 $g/cm^3$, the heatsink 40 material has a density of about 1-3 $g/cm^3$. Further, unlike copper and aluminum, the heatsink 40 material has a coefficient of thermal expansion comparable to silicon and therefore problems due to thermal failure of the contact between the chip 10 and the heatsink 40 are avoided.

FIG. 1B illustrates an embodiment in which the heatsink 40 is coupled to the core layer 30 from the two adjacent sides. In an alternative embodiment illustrated in FIG. 1C, the heatsink 40 is coupled to the core layer 30 from all the four sides.

Although FIGS. 1B and 1C illustrate the connecting members 60 as a trench, embodiments of the invention also include a plurality of vias which may be circular or elongated.

Figure 2C:
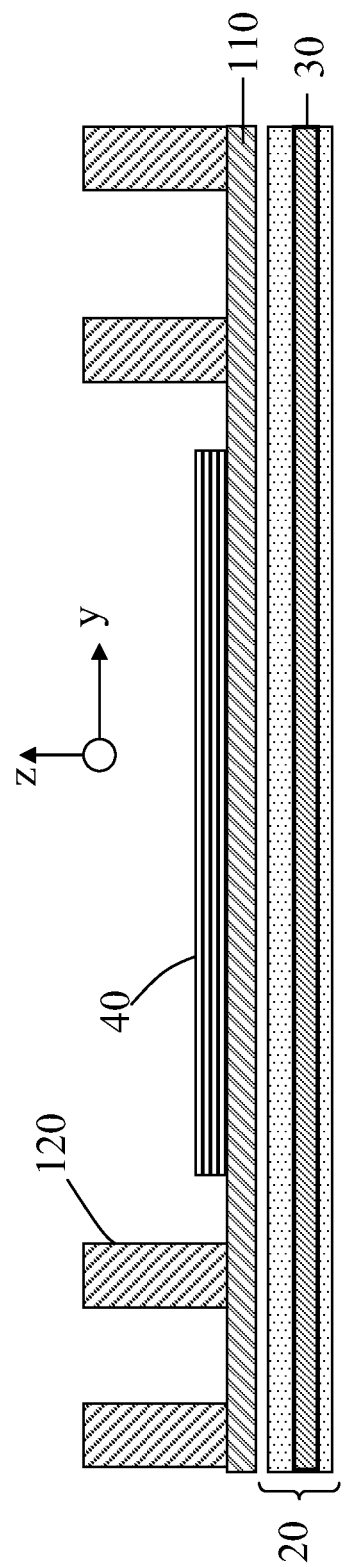

FIG. 2, which includes FIGS. 2A-2C, illustrates embodiments of the heat sink having additional fins.

FIG. 2 includes all the features of FIG. 1 but also included a further bottom fin structure. FIG. 2A show a cross-sectional view and FIG. 2B illustrates a top view.

Referring to FIG. 2A, a plurality of bottom fins 110 are placed under the bottom surface of the heatsink 40. In various embodiments, the plurality of bottom fins 110 may comprise a suitable thermal conductive material including copper, aluminum etc.

Because of the larger lateral conduction, the bottom surface of the heatsink 40 will likely be hotter than the top surface. Therefore, adding fins on the bottom surface of the heatsink 40 can help to remove some fraction of the heat from the heatsink 40. The fins may be air cooled naturally or through the passage of forced cooling air.

FIG. 2C illustrates an optional embodiment in which the plurality of bottom fins 110 may be coupled to other fin structures 120 to enhance the rate of cooling through the fins. The perpendicular fin structures 120 are shown only as an illustration, but in various embodiments, any suitable structure may be adopted.

FIG. 3, which includes FIGS. 3A-3B, illustrates an embodiment of the invention including top fins along with the heat sink.

Referring to the cross sectional view of FIG. 3A, a plurality of top fins 150 is placed over the top surface of the heatsink 40. In various embodiments, the plurality of top fins 150 may be formed using any suitable structure to enhance efficiency of the cooling process.

While not separately illustrated, embodiments of the invention also include using the plurality of top fins 150 without including the plurality of bottom fins 110.

In one or more embodiments, a thickness of the heatsink 40 is selected as a function of the anisotropy of the heatsink 40. For example, if the thermal conductivity along the x-direction is n times the thermal conductivity along the z-direction, then the thickness of the heatsink 40 along the z-direction may be chosen to be about 5/n to about 1/n.

Figure 4:
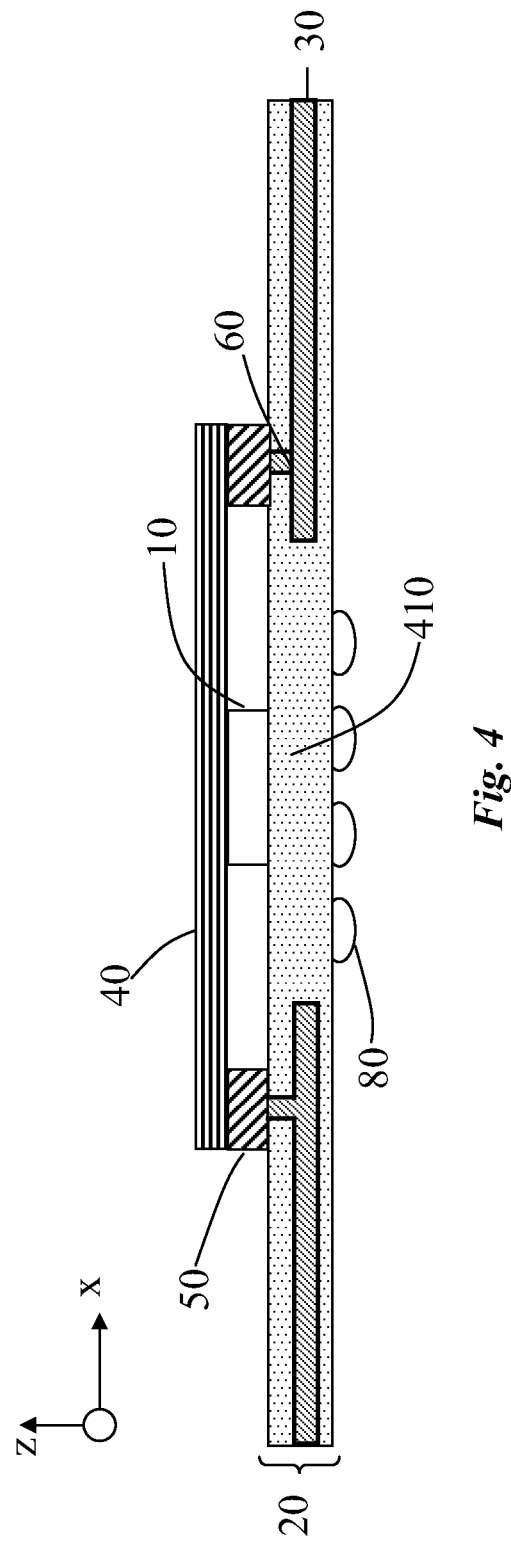
FIG. 4 illustrates an embodiment of the invention having a separate or concentric core layers within the circuit board.

FIG. 4 illustrates an embodiment of the invention having a separate or concentric core layers within the circuit board.

Unlike the prior embodiments, the substrate 20 may comprise a plurality of thermally separate regions. For example, a central portion 410 of the substrate 20 may not include the core layer 30 to avoid interfering with the electrical signals passing from the chip 10 through the substrate 20. The chip 10 may be coupled to external circuits/potentials, for example, through the plurality of contacts 80 disposed on the underside of the substrate 20. Through vias within the substrate 20 may be used to couple the top side of the substrate 20 adjacent the chip 10 to the underside of the substrate 20 having the plurality of contacts 80.

In this embodiment, the core layer 30 may be formed as multiple independent layers, or a single concentric layer surrounding the central portion 410, for example, from all sides.

Figure 5:
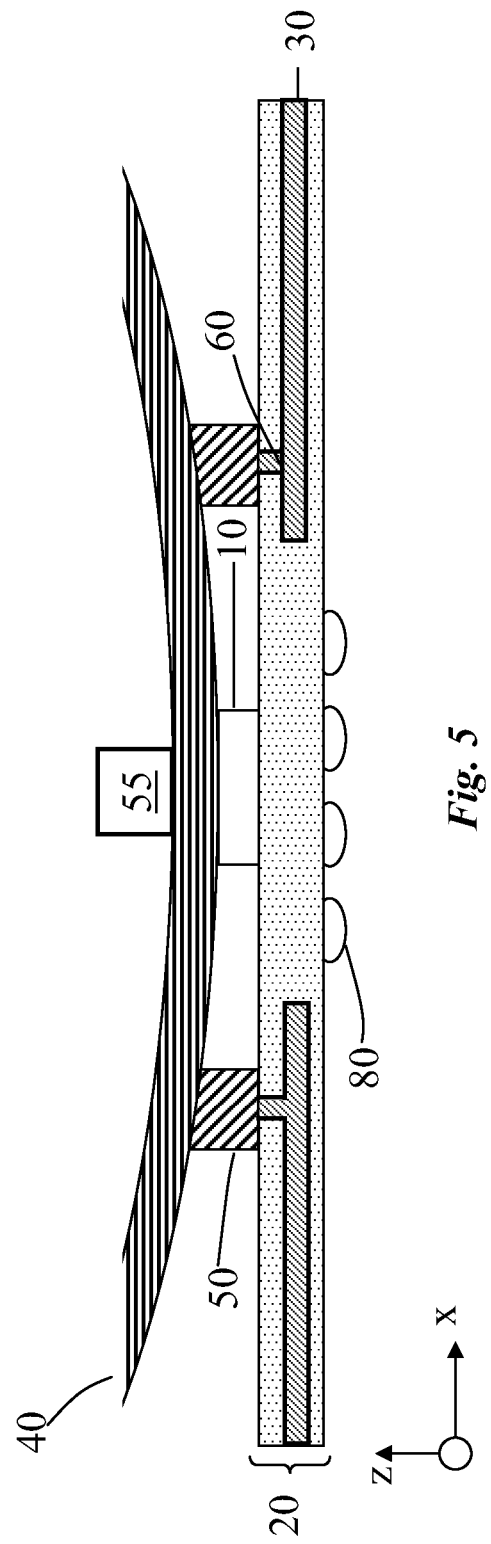
FIG. 5 illustrates a heatsink having a curved structure in accordance with another embodiment of the invention.

FIG. 5 illustrates a heatsink having a curved structure in accordance with another embodiment of the invention.

In this embodiment, the heatsink 40 is curved to enhance the contact area between the various contact surfaces. The increased contact area improves the heat transfer through the contact and therefore the heat dissipation from the chip 10. As an illustration, the height of the blocks 50 may be higher than a height of the chip 10. The heatsink 40 may be inserted into the gap between the clamp 55 and the chip 10. As the clamp 55 is lowered, the heatsink 40 contacts the top surface of the chip 10. The applied pressure from the clamp 55 and the blocks 50 ensures that the contact area between the heatsink 40 and the chip 10, and the contact areas between the heatsink 40 and the blocks 50 are maximized. The clamp 55 may be replaced with other mechanisms in various embodiments, for example, tape, frames etc.

Figure 6A:
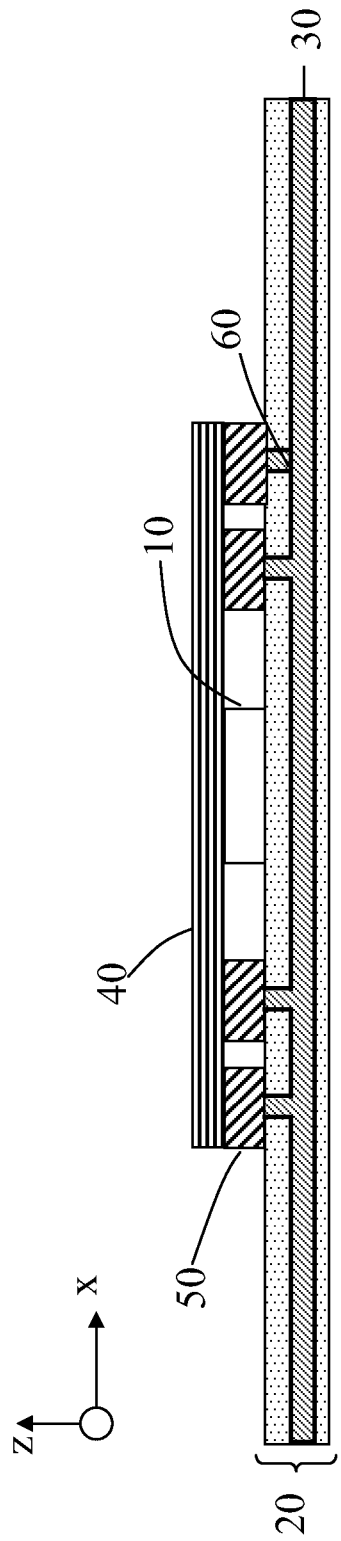
FIGS. 6A and 6B, illustrates an alternative embodiment of the invention including a plurality of paths for transferring heat from the heatsink to the substrate.
Figure 6B:
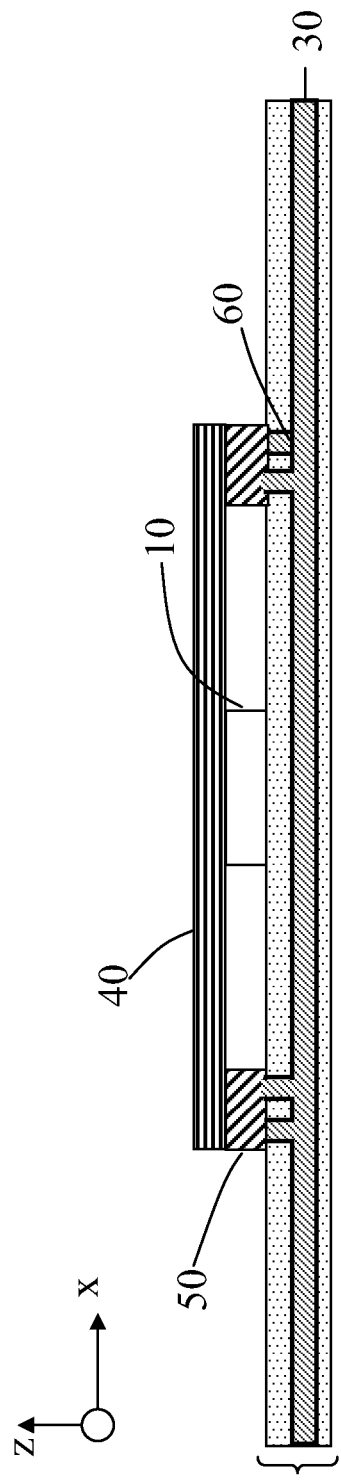

FIG. 6, which includes FIGS. 6A and 6B, illustrates an alternative embodiment of the invention including a plurality of paths for transferring heat from the heatsink to the substrate.

As illustrated in FIG. 6, a plurality of thermal conductive paths may be used to more efficiently transfer heat from the heatsink 40. In FIG. 6A, a plurality of blocks 50 and connecting members 60 may be used.

FIG. 6B illustrates an alternative embodiment in which the number of connecting members 60 is higher relative to the number of blocks 50. This helps to increase the cross-sectional area of the connecting members 60 thereby increasing the heat transfer capacity of the connecting members 60.

Figure 7:
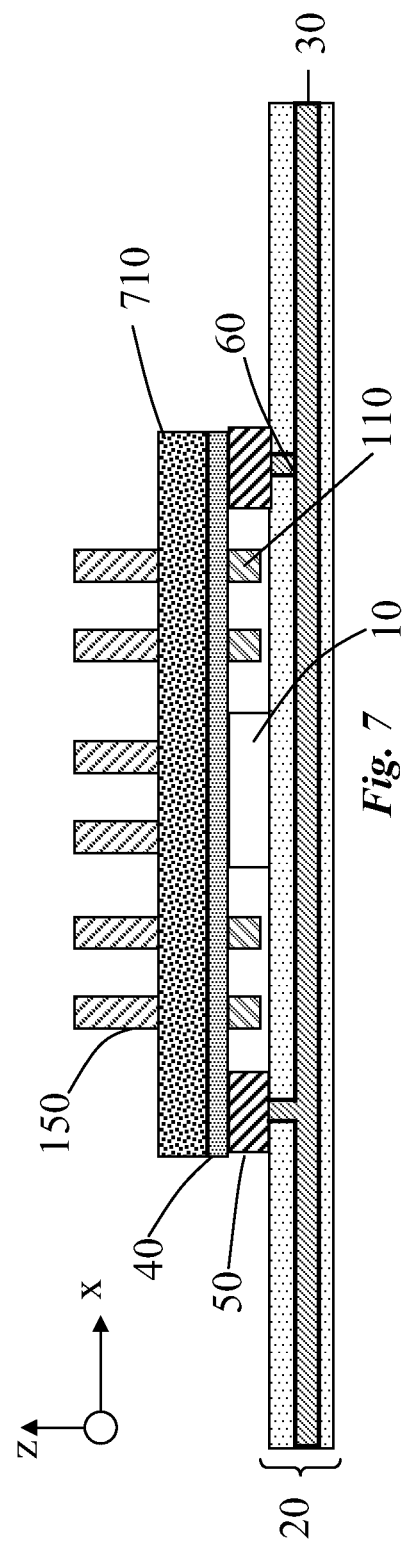
FIG. 7 illustrates a device having a plurality of heatsinks in which at least one of the heat sink has an anisotropic thermal conductivity in accordance with an embodiment of the invention.

FIG. 7 illustrates a device having a plurality of heatsinks in which at least one of the heatsink has an anisotropic thermal conductivity in accordance with an embodiment of the invention.

Referring to FIG. 7, a heatsink 40 is disposed over a chip 10 as in prior embodiments. However, a further heatsink 710 is disposed on the heatsink 40. The further heatsink 710 may have an isotropic thermal conductance whereas the heatsink 40 may have a anisotropic thermal conductance. Therefore, in this embodiment, the heat transfer is efficiently performed from the bottom side of the heatsink 40 through the substrate 20 and/or the plurality of bottom fins 110 as discussed in various embodiments. Alternatively, the fraction of heat reaching the top surface of the heatsink 40 is removed using a second heatsink, which may include larger and more number of fins, e.g., a plurality of top fins 150. The larger and more extensive fin structure ensures that the heat conducting through the heatsink 40 along the z-axis can be efficiently removed through the further heatsink 710.

FIG. 8, which includes FIGS. 8A-8B, illustrates an embodiment of the invention including through via structures in the heat sink, wherein FIG. 8A illustrates a cross-sectional view and FIG. 8B illustrates a top view. The through via structures may efficiently remove heat along the vertical direction especially when combined with other embodiments of the invention, for example, top fins 150 of FIG. 3, a further heat sink 710 of FIG. 7 etc.

Referring to FIG. 8A and FIG. 8B, a plurality of through vias 210 are disposed in the heatsink 40. In various embodiments, the through vias 210 are filled with a conductive substance having good conductance along the vertical axis (z-axis). For example, the through vias 210 may be filled with a high thermal conductivity material such as copper. Alternatively, the through vias 210 may be plated with a thermally and/or electrically conductive material to further enhance the conductivity. In one embodiment, the through vias 210 may be coated with silver while the inner core is filled with a thermally conductive material such as copper. In another embodiment, the outer sidewalls of the through vias 210 may be coated directly, for example, with diamond and/or graphene.

FIG. 8B also illustrates a plurality of through substrate bars 220 disposed in the heatsink 40. Unlike the through vias 210, the through substrate bars 220 have a length longer than the width. In one or more embodiments, the orientation of the through substrate bars 220 is selected to minimize interruption of the lateral thermal conduction through the heatsink 40. For example, in one embodiment, if the lateral conduction along the x-axis is larger through the heatsink 40 than through the y-axis, it may be optimal to orient the through substrate bars 220 along the y-axis.

Similar to the through vias 210, the through substrate bars 220 may be filled with a conductive substance having good conductance along the vertical axis (z-axis). For example, the through substrate bars 220 may be filled with a high thermal conductivity material such as copper. Alternatively, the through substrate bars 220 may be plated with a thermally and/or electrically conductive material to further enhance the conductivity. In one embodiment, the through substrate bars 220 may be coated with silver while the inner core is filled with a thermally conductive material such as copper. In another embodiment, the outer sidewalls of the through substrate bars 220 may be coated directly, for example, with diamond and/or graphene.

Figure 9:
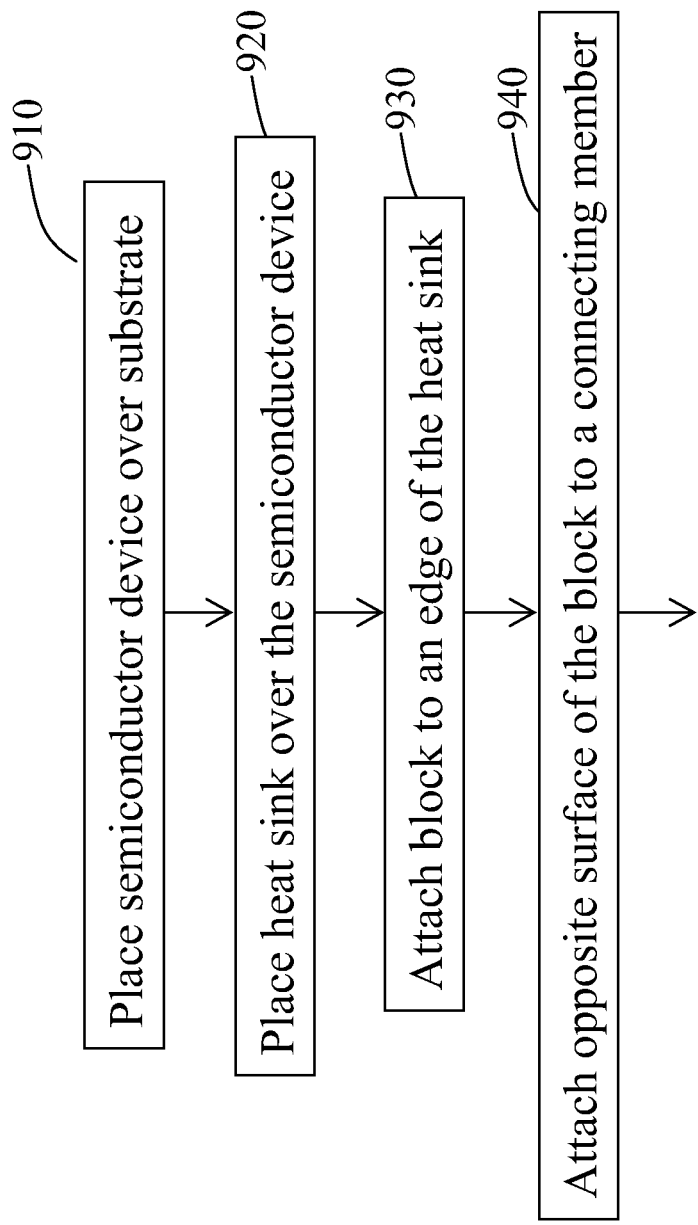
FIG. 9 illustrates a flow chart of a method of forming a printed circuit board assembly in accordance with embodiments of the invention.

FIG. 9 illustrates a flow chart of a method of forming a printed circuit board assembly in accordance with embodiments of the invention.

Referring to the flow chart of FIG. 9, a semiconductor device, such as chip 10 in FIGS. 1-8, may be placed over a substrate having a thermally conductive core layer, such as core layer 30 in FIGS. 1-8 (box 810). Examples of the substrate include the substrate 20 as described in FIGS. 1-8. The heat sink, such as heatsink 40 described in FIGS. 1-8, having an anisotropic thermal conductivity is positioned over the semiconductor device (box 820).

The heat sink is coupled thermally to the substrate (boxes 830 and 840). In various embodiments, the bottom surface of the heat sink may be coupled, using, for example, a thermal interface material (TIM). A TIM layer may be coated on a top surface of the block and/or the bottom surface of the heat sink. The thermal bond between the block and the heat sink may be achieved by a curing process, or a high temperature process, as needed. The opposite bottom surface of the block may be coupled to the connecting members 60, which may be a via or a trench, for example, using a soldering process. The connecting members may be thermally coupled (e.g., during the fabrication of the substrate) to the thermally conductive core layer.

Embodiments herein described above thus provide for a low cost anisotropic heatsink with a very high thermal conductivity in at least one lateral direction (e.g., x-axis, y-axis, or both x-axis and y-axis). While the z-axis conductivity may remain relatively poor (e.g., around 20 W/mK), various embodiments described herein overcome this limitation by an approach that maximizes lateral conduction of heat.

Embodiments advantageously provide for a low cost heatsink relative to aluminum or copper heatsink. In addition to the lower cost, embodiments also advantageously allow for a lightweight heatsink, for example, lighter than a comparable aluminum or copper heatsink. Thus, the lightweight heat sinks described herein are extremely desirable for weight sensitive applications like assemblies for routers and servers.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a circuit board having a thermally conductive core layer and a central portion, wherein the thermally conductive core layer is disposed around the central portion of the circuit board, and wherein the central portion is thermally and electrically isolated from the thermally conductive core layer;
   a chip disposed over the central portion of the circuit board; and
   a heat sink disposed over the chip, wherein a thermal conductivity of the heat sink along a first direction is larger than a thermal conductivity along a second direction, the first direction being perpendicular to the second direction, and wherein the heat sink is thermally coupled to the thermally conductive core layer.

2. The device of claim 1, further comprising:
   a first heat transferring block disposed on a bottom surface of the heat sink, the first heat transferring block disposed between an edge of the heat sink and the circuit board; and
   a first connecting member disposed in the circuit board and thermally coupled between the first heat transferring block and the thermally conductive core layer, wherein the heat sink is thermally coupled to the thermally conductive core layer through the first heat transferring block and the first connecting member.

3. A device comprising:
   a circuit board having a thermally conductive core layer;
   a chip disposed over the circuit board;
   a heat sink disposed over the chip, wherein a thermal conductivity of the heat sink along a first direction is larger than a thermal conductivity along a second direction, the first direction being perpendicular to the second direction, and wherein the heat sink is thermally coupled to the thermally conductive core layer;
   a first heat transferring block disposed on a bottom surface of the heat sink, the first heat transferring block disposed between an edge of the heat sink and the circuit board;
   a first connecting member disposed in the circuit board and thermally coupled between the first heat transferring block and the thermally conductive core layer, wherein the heat sink is thermally coupled to the thermally conductive core layer through the first heat transferring block and the first connecting member;

a second heat transferring block disposed on the bottom surface of the heat sink, the second heat transferring block disposed between the first heat transferring block and the chip; and a second connecting member disposed in the circuit board and thermally coupled between the second heat transferring block and the thermally conductive core layer.

4. A device comprising:

a circuit board having a thermally conductive core layer;

a chip disposed over the circuit board;

a heat sink disposed over the chip, wherein a thermal conductivity of the heat sink along a first direction is larger than a thermal conductivity along a second direction, the first direction being perpendicular to the second direction, and wherein the heat sink is thermally coupled to the thermally conductive core layer;

a first heat transferring block disposed on a bottom surface of the heat sink, the first heat transferring block disposed between an edge of the heat sink and the circuit board;

a first connecting member disposed in the circuit board and thermally coupled between the first heat transferring block and the thermally conductive core layer, wherein the heat sink is thermally coupled to the thermally conductive core layer through the first heat transferring block and the first connecting member; and a second connecting member thermally coupled between the first heat transferring block and the thermally conductive core layer.

5. The device of claim 1, wherein the heat sink comprises graphene fibers oriented along the first direction.

6. The device of claim 1, wherein the heat sink comprises through substrate structures.

7. The device of claim 1, further comprising a plurality of bottom fins disposed on a bottom surface of the heat sink, the bottom surface of the heat sink being closer to the chip than an opposite top surface of the heat sink.

8. The device of claim 7, further comprising a plurality of auxiliary fins coupled to the plurality of bottom fins, the plurality of auxiliary fins oriented in a different direction than the plurality of bottom fins.

9. The device of claim 1, further comprising a plurality of top fins disposed on a top surface of the heat sink, the top surface of the heat sink being farther from the chip than an opposite bottom surface of the heat sink.

10. The device of claim 1, further comprising a thermal interface material layer disposed between the chip and the heat sink.

11. The device of claim 1, wherein the heat sink is curved with a concave surface, wherein a central region of the heat sink is nearer to the circuit board than a surrounding peripheral region of the heat sink.

12. The device of claim 1, wherein the heat sink is coupled to the thermally conductive core layer through at least two conductive thermal paths.

13. The device of claim 1, further comprising an isotropic heat sink disposed over the heat sink; and a plurality of top fins disposed over the isotropic heat sink.

14. The device of claim 13, wherein the isotropic heat sink comprises aluminum.

15. The device of claim 1, wherein the thermal conductivity of the heat sink along a first direction is about 400 W/mK to about 1200 W/mK, and wherein the thermal conductivity of the heat sink along the second direction is about 20 W/mK to about 100 W/mK.

16. A printed circuit board assembly comprising:

a substrate having a thermally conductive core layer;

a semiconductor device disposed over the substrate; and a heat sink having an anisotropic thermal conductivity disposed over the semiconductor device, wherein a bottom surface of the heat sink is thermally coupled to the thermally conductive core layer, the bottom surface of the heat sink being closer to the semiconductor device than an opposite top surface of the heat sink, wherein the heat sink is curved with a concave surface, and wherein a nearest distance from a central region of the heat sink to the substrate is smaller than a nearest distance from a surrounding peripheral region of the heat sink to the substrate.

17. The printed circuit board assembly of claim 16, further comprising:

a heat transferring block disposed between an edge of the heat sink and the substrate on the bottom surface of the heat sink; and a connecting member disposed in the substrate and thermally coupled between the heat transferring block and the thermally conductive core layer.

18. The printed circuit board assembly of claim 16, wherein the heat sink comprises graphene fibers.

19. The printed circuit board assembly of claim 16, further comprising a plurality of bottom fins disposed on the bottom surface of the heat sink.

20. The printed circuit board assembly of claim 19, further comprising a plurality of auxiliary fins coupled to the plurality of bottom fins, the plurality of auxiliary fins oriented in a different direction than the plurality of bottom fins.

21. A method for forming a printed circuit board assembly, the method comprising:

placing a semiconductor device over a substrate, the substrate having a thermally conductive core layer;

placing a heat sink having an anisotropic thermal conductivity over the semiconductor device; and thermally coupling a bottom surface of the heat sink to the thermally conductive core layer, the bottom surface of the heat sink being closer to the semiconductor device than an opposite top surface of the heat sink, wherein thermally coupling a bottom surface of the heat sink to the thermally conductive core layer comprises attaching a top surface of a first heat transferring block to an edge of the heat sink, attaching a top surface of a second heat transferring block to the bottom surface of the heat sink, and attaching an opposite bottom surface of the first heat transferring block to a first connecting member in the substrate and an opposite bottom surface of the second heat transferring block to a second connecting member in the substrate, the first and the second connecting members being thermally coupled to the thermally conductive core layer.

22. The method of claim 21, wherein the heat sink comprises graphene fibers.

23. The method of claim 21, further comprising thermally coupling a plurality of bottom fins to the bottom surface of the heat sink.

24. The device of claim 1, wherein the second direction is oriented along a direction extending from the circuit board to the heat sink.

25. The printed circuit board assembly of claim 16, further comprising a clamp disposed over the heat sink, the clamp being configured to apply pressure between the heat sink and the semiconductor device.

* * * * *